(12) United States Patent
Bijvoet (10) Patent No.: US 7,372,549 B2
(45) Date of Patent: May 13, 2008

(54) LITHOGRAPHIC APPARATUS AND DEVICE MANUFACTURING METHOD

(75) Inventor: Dirk Jan Bijvoet, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 334 days.

(21) Appl. No.: 11/165,574

(22) Filed: Jun. 24, 2005

(65) Prior Publication Data

US 2006/0290915 A1    Dec. 28, 2006

(51) Int. Cl.
    G03B 27/62    (2006.01)
    G03B 27/58    (2006.01)

(52) U.S. Cl. .......................................... 355/75; 355/72

(58) Field of Classification Search ................ 355/53, 355/72, 75, 77
    See application file for complete search history.

(56) References Cited

U.S. PATENT DOCUMENTS

| 4,842,136 | A | | 6/1989 | Nakazato et al. ............ 206/328 |
| 5,923,408 | A | * | 7/1999 | Takabayashi ................. 355/53 |
| 6,307,620 | B1 | * | 10/2001 | Takabayashi et al. ......... 355/72 |
| 6,535,274 | B2 | | 3/2003 | Antoni ......................... 355/67 |
| 6,664,549 | B2 | * | 12/2003 | Kobayashi et al. ..... 250/440.11 |
| 7,089,073 | B2 | * | 8/2006 | Tsuji et al. .................. 700/114 |
| 7,233,383 | B2 | * | 6/2007 | Tokita et al. .................. 355/30 |

FOREIGN PATENT DOCUMENTS

| EP | 1 241 706 A2 | 9/2002 |
| EP | 1 369 745 A1 | 12/2003 |
| EP | 1 486 828 A2 | 12/2004 |
| EP | 1 491 953 A1 | 12/2004 |
| TW | 200508813 | 3/2005 |
| TW | 1230844 | 4/2005 |

OTHER PUBLICATIONS

Eduard Arzt, et al., "From Micro to Nano Contacts in Biological Attachment Devices," PNAS (Germany), vol. 100 ( No. 19), p. 10603-10606, ( Sep. 16, 2003).
European Search Report issued for European Patent Application No. 06076204.4-2222, dated Sep. 11, 2006.
Une, et al., "A New Vacuum Pin Chuck for ArF Laser Lithography," Microelectronic Engineering 61-62 (2002) pp. 113-121.
Autumn, et al., "Evidence for Van Der Waals Adhesion in Gecko Setae," PNAS, vol. 99, No. 19, Sep. 17, 2002, pp. 12252-12256.
Taiwanese Search Report issued for ROC (Taiwan) Patent Application No. 095120809, dated Sep. 7, 2007.

* cited by examiner

*Primary Examiner*—Rodney Fuller
(74) *Attorney, Agent, or Firm*—Pillsbury Winthrop Shaw Pittman, LLP (57) ABSTRACT

A lithographic apparatus is disclosed that has a support structure constructed to support a patterning object, the patterning object being capable of imparting a radiation beam with a pattern in its cross-section to form a patterned radiation beam, a substrate table constructed to hold a substrate, or both, wherein the support structure, the substrate table, or both, has a contact surface with which the patterning object, the substrate, or both, are configured to be in contact, respectively, the contact surface having a plurality of sub-contact surfaces to increase a mutual adhesion between the support structure and the patterning object, the substrate table and the substrate, or both.

20 Claims, 7 Drawing Sheets

LITHOGRAPHIC APPARATUS AND DEVICE MANUFACTURING METHOD

1. FIELD

The present invention relates to a lithographic apparatus and a method for manufacturing a device.

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A conventional lithographic apparatus, typically comprises a support structure (also referred to as a mask stage) that is provided and constructed to support the patterning device. Similarly, the apparatus comprises a substrate table which is constructed to hold the substrate. Conventionally, the mask is clamped by vacuum to the mask stage chuck which is fixedly held on the mask stage. The maximum acceleration of the patterning device or mask is limited in conventional lithographic apparatuses by the vacuum pressure, the vacuum clamp area, friction between the mask and the chuck and the mask mass, in order to prevent the mask from micro and macro slip. The support structure and substrate table are movable in a scanning (Y) direction. In particular, at the beginning and towards the end of a scanning cycle, the support structure and substrate table are subject to acceleration and deceleration forces to reach a scanning velocity and to come to a standstill, respectively. In order to increase the throughput of the machine, i.e. the number of substrates that can be processed with the lithographic apparatus in a certain time, it is desirable that the support structure and substrate table reach and decelerate from the scanning speed as quickly as possible. To achieve this, the acceleration and deceleration of the support structure and/or substrate table must be increased. It has been found, however, that this results in an increased inertia force to the mask and/or substrate, and an increased risk of micro and macro slip of the mask and/or substrate. This leads to imaging errors. In particular, with respect to the mask stage when it is subject to increased inertia forces, conventional vacuum clamps may not be able to clamp the mask with sufficient force.

3. SUMMARY

It is desirable to provide a support structure and/or substrate table which can be accelerated and decelerated at increased rates without increasing the incidence of slippage of the mask and substrate, respectively. It is further or alternatively desirable to improve the adhesion of the mask and substrate to the support structure and substrate table, respectively.

According to an aspect of the invention, there is provided a lithographic apparatus, comprising:

a support structure constructed to support a patterning object, the patterning object being capable of imparting the radiation beam with a pattern in its cross-section to form a patterned radiation beam, a substrate table constructed to hold a substrate, or both; and wherein the support structure, the substrate table, or both, comprises a contact surface with which the patterning object, the substrate, or both, are configured to be in contact, respectively, the contact surface comprising a plurality of sub-contact surfaces to increase a mutual adhesion between the support structure and the patterning object, the substrate table and the substrate, or both.

According to an aspect of the invention, there is provided an apparatus comprising a support structure constructed to support an object and arranged to move in a direction, the support structure comprising a contact surface with which the object is configured to be in contact, the contact surface comprising a plurality of sub-contact surfaces to increase a mutual adhesion between the support structure and the object, so that the object is held on the support structure when the support structure moves in the direction.

According to an aspect of the invention, there is provided a device manufacturing method, comprising:

supporting a patterning object on a support structure, the patterning object being capable of imparting a radiation beam with a pattern in its cross-section to form a patterned radiation beam, holding a substrate on a substrate table, or both, wherein the support structure, the substrate table, or both, comprises a contact surface with which the patterning object, the substrate, or both, are in contact, respectively, the contact surface comprising a plurality of sub-contact surfaces to increase a mutual adhesion between the support structure and the patterning object, the substrate table and the substrate, or both, respectively; and projecting a patterned beam of radiation onto a substrate.

According to an aspect of the invention, there is provided a method comprising supporting an object on a support structure, wherein the support structure is arranged to move in a direction and comprises a contact surface with which the object is in contact, the contact surface comprising a plurality of sub-contact surfaces to increase a mutual adhesion between the support structure and the object, so that the object is held on the support structure when the support structure moves in the direction.

According to an aspect of the invention, there is provided a method of manufacturing a support structure configured to support an object, the support structure comprising a contact surface comprising a plurality of sub-contact areas to increase an adhesion between the support structure and the object, comprising manufacturing the plurality of sub-contact areas using a MEMS technology.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

Like reference symbols in the various figures indicate like elements.

5. DETAILED DESCRIPTION

Figure 1:
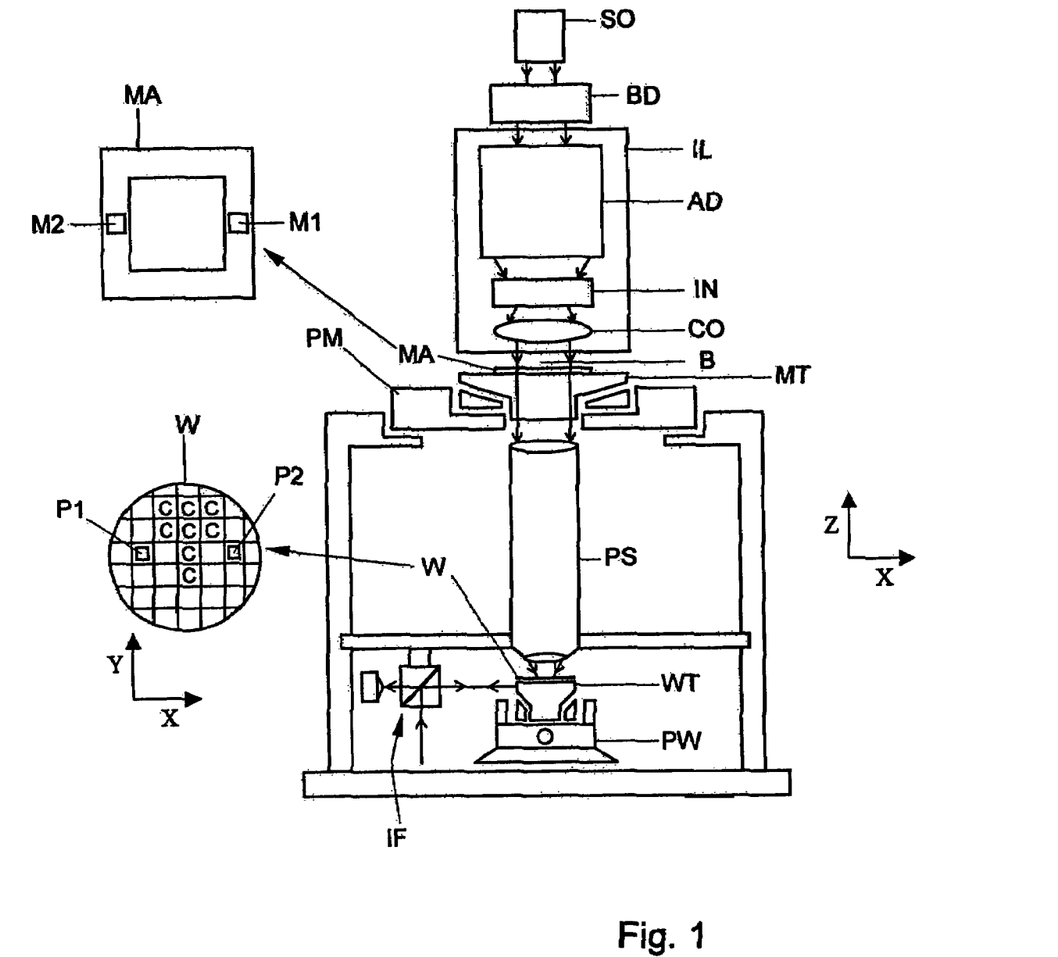
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table, also referred to as a reticle stage) MT constructed to support a patterning object (e.g. a mask, also referred to as a reticle) MA and connected to a first positioner PM configured to accurately position the patterning object in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning object MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning object in a manner that depends on the orientation of the patterning object, the design of the lithographic apparatus, and other conditions, such as for example whether or not the patterning object is held in a vacuum environment. The support structure can use mechanical, vacuum, electrostatic or other clamping techniques to hold the patterning object. The support structure may be a frame or a table, for example, which may be fixed or movable as required. The support structure may ensure that the patterning object is at a desired position, for example with respect to the projection system. Any use of the terms "reticle" or "mask" herein may be considered synonymous with the more general term "patterning object."

The term "patterning object" used herein should be broadly interpreted as referring to any object that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning object may be transmissive or reflective. Examples of patterning objects include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning object (e.g., mask MA), which is held on the support structure (e.g., mask table MT), and is patterned by the patterning object. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning object, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning object, such as a programmable mirror array of a type as referred to above.

Combinations and/or variations on the above described modes of use or entirely different modes of use may also be employed.

In the embodiments described below with reference to FIGS. 2-7, the invention is described in particular, with reference to the adhesion of a mask to a mask table. However, the invention is not limited in this respect, and is equally applicable to a substrate held on a substrate table. Further, the invention has application in fields beyond that of lithography, where adhesion of one object to another is desirable.

Figure 2:
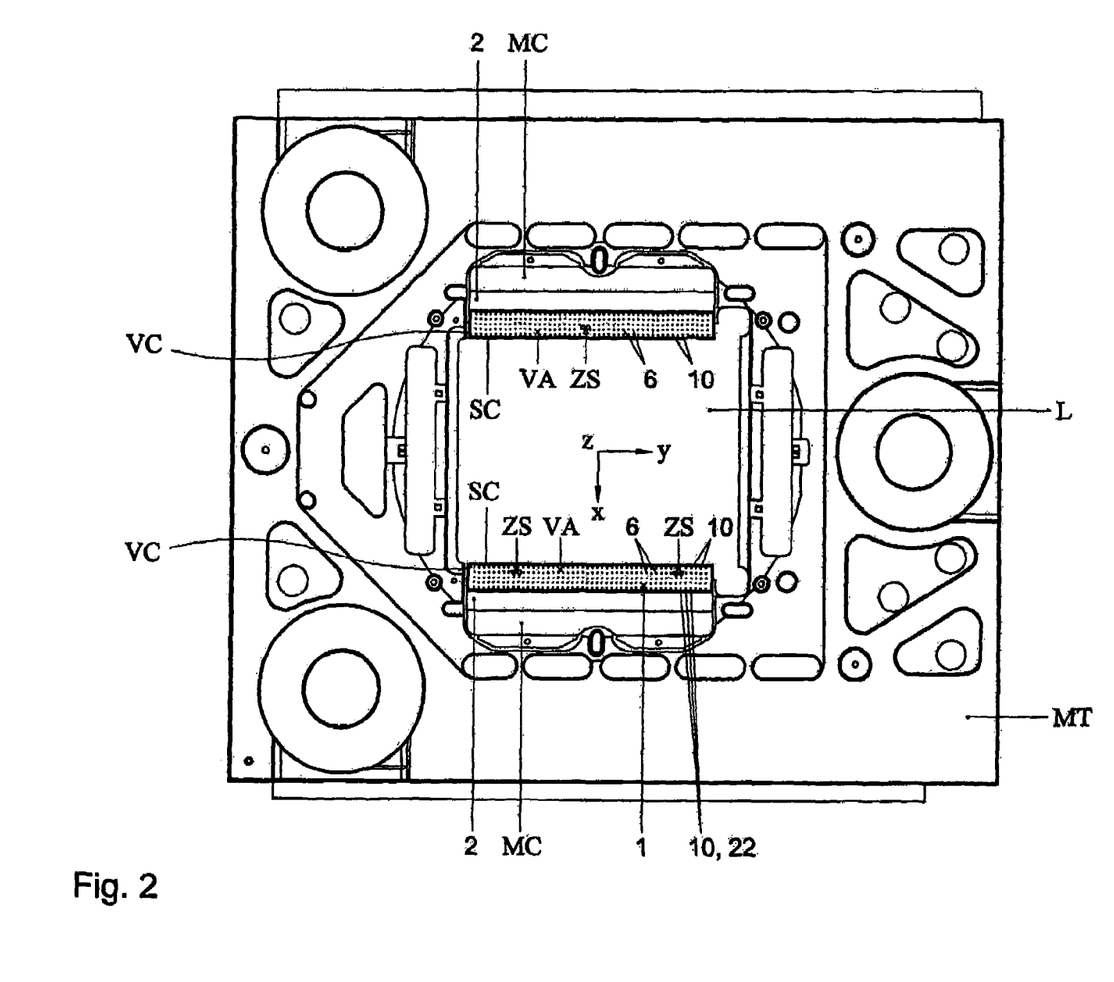
FIG. 2 depicts a plan view of a mask table according to an embodiment of the invention.

FIG. 2 depicts a plan view of a mask table according to an embodiment of the invention. The mask table MT comprises vacuum clamps VC which produce a relative low pressure in the area under which the mask MA is disposed causing the mask M to be sucked to the mask table MT. The vacuum clamps VC comprise a vacuum area VA substantially over which the relatively low pressure is provided. The vacuum clamps VC further comprise a suction cup SC which defines the boundary of the vacuum area VA. In the embodiment shown, two vacuum clamps VC are shown (although a single clamp VC may be used). A clamp VC is disposed at either end of a location L at which the mask MA is to be placed. The clamps VC extend along the length of the location L in the direction of scanning Y. The location of the vacuum clamps VC is such that they do not extend into the region in which the projection beam passes. Since the vacuum clamps VC cannot extend into the transmissive region of the mask MA, the size of the clamps are limited so the amount of vacuum force that can be applied to the mask MA to hold it in place is limited. Each vacuum clamp VC is mounted on the mask table MT by a leaf spring 2. The mask table MT includes a mask chuck MC. In particular, the leaf spring 2 mounts the respective vacuum clamp VC onto the mask chuck MC. The leaf spring 2 extends in the scanning direction along the length of the respective vacuum clamp VC. Each vacuum clamp VC, CL has a suction cup CU, SC having a vacuum clamp area VA, see also FIG. 3. The suction cup SC comprises a plurality of burls 6 which are disposed to support the mask MA. The suction cup SC is dimensioned in order to provide a vacuum clamping effect along the length of the mask MA in the scanning direction Y. Thus, the dimensions of the suction cup SC will depend on the size of the particular mask MA. Typical dimensions of the suction cup SC are 130 mm in the scanning direction Y and 30 mm in the perpendicular X direction.

Figure 3:
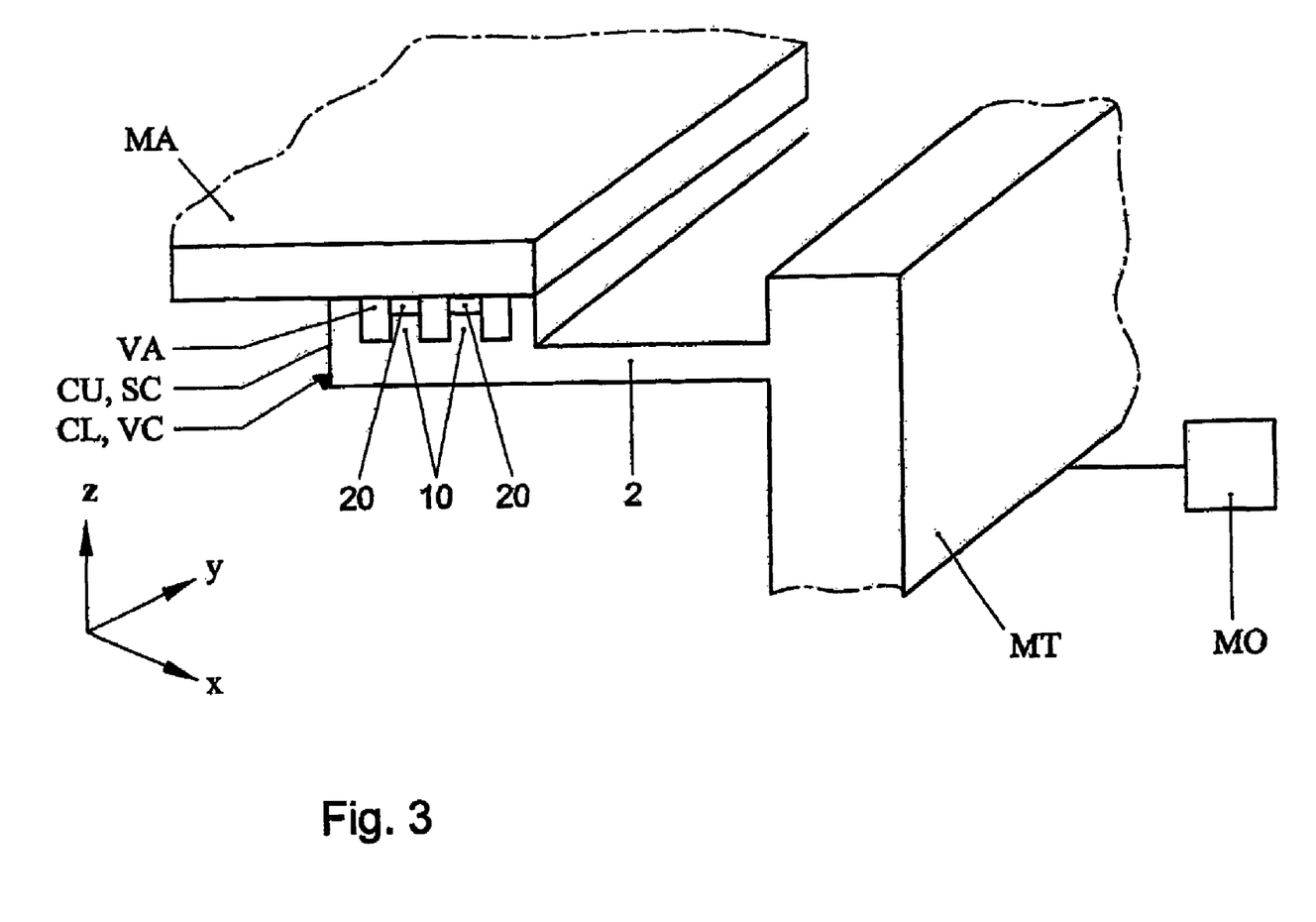
FIG. 3 depicts details of a mask table supporting a mask according to an embodiment of the invention.
Figures 4A, 4B:
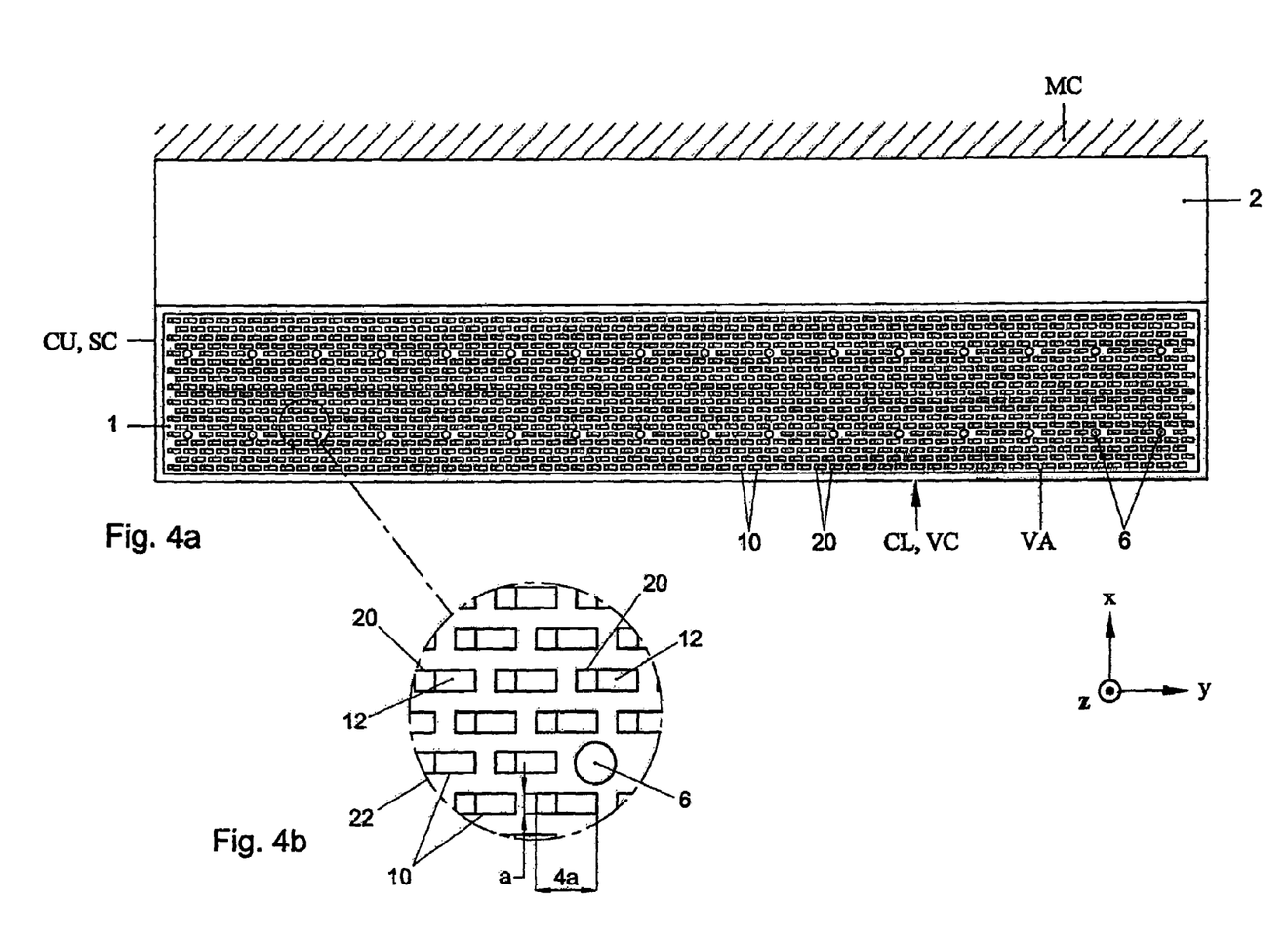
FIG. 4a depicts a plan view of a mask table according to an embodiment of the invention.
FIG. 4b depicts a detailed plan view of a section of the mask table shown in FIG. 4a including a plan view of the plurality of setae.

The suction cup SC further comprises a plurality of setae 10, see FIG. 4a. In one embodiment, the plurality of setae 10 are provided in the vacuum clamp area VA. The plurality of setae 10 are micromechanical devices. A contact surface 1 between the mask MA and the mask table MT is formed by the surface of the burls 6 and the setae 10. The plurality of setae 10 form a patterned surface structure 22 which interacts with the surface of the mask MA. A principle of contact mechanics is exploited: that is by splitting up the contact surface into finer sub-contact surfaces 20 the adhesion between the mask MA and the mask table MT is increased. As described in detail below with particular reference to FIGS. 3-7, the patterned surface structure 22 comprises a plurality of setae 10. In the text hereinbelow, the plurality of setae are also referred to as micro terminal elements or micro structures. In the schematic figures, the micro terminal elements 10 are not shown to scale, but are enlarged with respect to their proportional actual size.

The plurality of setae 10 may further be configured as micro leaf springs. In such an embodiment, the plurality of setae may also be referred to as micro leaf springs. The micro leaf springs 10 are attached at one end to a vacuum clamp VC, in particular, the suction cup SC, and at the other end making contact, to thus achieve a degree of adhesion, with the mask. Each micro leaf spring 10 counteracts a small portion of the inertia forces to the mask MA. By increasing the mutual adhesion between the mask MA and the mask table MT, the risk of micro and macro slip of the mask is reduced, in particular, when the acceleration or deceleration level of the mask stage MT is increased within the current vacuum clamp area limits. In the embodiment shown, the plurality of setae 10 are provided in combination with the vacuum clamps VC. However, a vacuum clamp VC is not essential to an embodiment of the invention, and sufficient adhesion may be achieved by the plurality of setae 10 alone without any additional vacuum force being applied. In such an embodiment, the suction cup SC provides a supporting and adhesive function and is referred to simply as a cup CU. Further, the clamping function is achieved by the adhesive force between the sub-contact areas 20 and the mask MA. Thus, similarly, in this embodiment, the vacuum clamp VC is simply referred to as a clamp CL. The mask table MT further includes Z-supports ZS for supporting the cup CU, VC and clamp CL, VC in the Z direction. The Z-supports ZS are shown in more detail in FIG. 7.

FIG. 3 depicts details of a mask table supporting a mask MA according to an embodiment of the invention. In particular, FIG. 3 shows how the mask MA is supported on the cup CU, SC. The cup CU may be made of the same material as the mask table MT. For example, the cup CU may be made of a glass material, such as ZERODUR ceramic, which has a very low coefficient of thermal expansion. Alternatively, it may be made of a metal. In FIG. 3, it is seen how the cup CU is mounted on the mask chuck MC by leaf spring 2. In this way, the cup CU is flexibly mounted on the mask chuck MC. The plurality of setae 10 comprise a sub-contact surface 20 in contact with the mask MA. The support structure MT is arranged to move in a scanning direction Y. A motor MO is connected to the support structure MT and is controlled in order to move the support structure MT in accordance with a desired scanning profile. The motor MO moves the support structure MT, the substrate table WT, or both in a scanning direction Y, the motor MO exerts an acceleration and/or deceleration force on the support structure MT, the substrate table WT, or both in the scanning direction Y, wherein the mutual adhesion between the patterning object MA and the support structure MT, the substrate W and the substrate table WT, or both, respectively, holds the patterning object MA and/or substrate W on the support structure MT and/or substrate table WT, respectively, when the support structure MT and/or substrate table WT, respectively, moves in the scanning direction.

The plurality of setae 10 are constructed to provide stiffness in the scanning direction. In this way, the risk of macro and micro slip is further reduced. Further, the plurality of setae 10 are constructed to provide flexibility in a direction substantially perpendicular to a plane in which the mask MA is disposed. In this way, the mask MA can be readily removed from the clamp CL, VC, for example, without having to apply any further removing forces. In particular, the sub-contact areas 20 provide a combined adhesion energy sufficient to adhere the patterning object MA to the support structure MT. Further, the adhesion energy between the sub-contact areas 20 and the patterning object MA is of the order of 20 milliJoules per meter squared. As discussed above, this principles and techniques may be applied, in addition or alternatively, to a substrate W on a substrate table WT.

The dimensions and number of setae per unit area depend inter alia on the mass of the patterning object which is to be held on the support structure. The dimensions are determined by applying the theory of contact mechanics. Some principles of contact mechanics are described in "From micro to nano contacts in biological attachment devices", Arzt et al, PNAS, Sep. 16, 2003, vol. 100, no. 19, 10603-10606.

An order of magnitude calculation is now given, by way of example, for the example of a mask (mask) held on a support structure. In the calculation, it is assumed that there is no clamp vacuum. Thus, all mask inertia forces are compensated by the setae and that the total clamp area is available for the setae.

The following values apply:
mass of the mask, m=350 [gr]
adhesion energy, j=20 [mJ/m$^2$]
total available clamp area, Aclamp=3.2×10$^{-3}$ [m$^2$]
geometry-insensitive parameter, k=3.8×10$^6$ [m$^{-1}$·kg$^{-1/3}$]
length to width ratio of 1 seta=4 to 1.

It will be understood that these values will vary depending on the particular application.

Calculation:
Setae aerial density: Na(m):=4·k$^2$·m$^{2/3}$=2.869E+13 [m$^{-2}$]
Number of setae:

$$n := \frac{4m1 \cdot g \cdot \sqrt{Na(m1)}}{3 \cdot \pi \cdot j} = 3.902E + 8 [-]$$

Area of 1 seta:

$$Asetae := \frac{Aclamp}{n} = 8.174 [\mu m^2]$$

Width of 1 seta $$a := \sqrt{\frac{Asetae}{4}} = 1.4 [\mu m]$$

Length of 1 seta 4a=5.7 [μm]

Thus, in general, the setae desirable to create the adhesion to hold an object having a mass of the order of 300-400 grams have micrometer dimensions and have a density of the order of 1000 setae/100 micrometers squared. The above calculation determines a desirable number and desirable dimensions of the setae to compensate for the mass of a mask. Whilst the acceleration of gravity is taken into account, other inertia forces, i.e. accelerations are not taken into account.

In the particular embodiment given above, it is seen that one seta has a sub-contact area of approximately 8 micrometers squared. Further, the setae density is approximately 2.8×10$^{13}$ [/m$^2$]. It will further be understood that the values and calculated values given above are not exact and that adhesion will be achieved by values deviating within certain error margins to those given. From order of magnitude calculations, that for a typical mask, for example, having a mass of approximately 350 grams and for a typical mask table acceleration of 50 meters per second per second approximately $2\times10^9$ micro structures are desired to keep the mask in its place using only adhesion forces. Within a typical clamping surface of approximately 320 millimeters squared, the approximate dimensions of the microstructures are approximately: length×width=2.5×1 micrometer. As hereinbelow described, such microstructures may be used either alone or in combination with a vacuum clamping system. For an embodiment where a combination of micro structures and vacuum clamping is used, the mask table MT may be accelerated at much greater acceleration rates, of for example, up to 50 meters per second per second faster than conventional mask tables, i.e. twice as fast. In other words, the combination of vacuum clamps and micro structured adhesion improves the apparent global friction coefficient by a factor of two.

FIG. 4a depicts a plan view of a mask clamp area and leaf spring 2 according to an embodiment of the invention. In particular, FIG. 4a shows details of the mask table MT depicted in FIG. 2. The clamp VC, CL comprises a cup CU, SC mounted to the mask chuck MC by a leaf spring 2. The contact surface 1 comprises a plurality of sub-contact surfaces 20 which are made up of a plurality of micro-dimensioned setae 10 which form a patterned surface structure 22. The cup CU further includes burls 6 which also support the mask MA. The mask MA (not shown) is disposed on the plurality of setae 10 and burls 6. The adhesion due to contact mechanics, as demonstrated in the calculations above, is sufficient to adhere the mask MA to the mask table MT. This is achieved without the need of vacuum clamping.

FIG. 4b depicts a detailed plan view of a section of the clamp area and leaf spring shown in FIG. 4a including a plan view of the plurality of setae. In particular, FIG. 4b depicts the patterned surface structure 22. As described in more detail with reference to FIG. 5, the micro terminal elements 10 comprise a first portion 8 (not shown in FIG. 4), a second portion 20 and an intermediate portion 12 joining the first and second portions 8, 20. The second portion 20 comprises the sub-contact area and the intermediate portion 12 is resilient. The length of the setae 10 in a scanning direction Y is approximately 4 times the width of the setae in a direction X substantially perpendicular to the scanning direction and substantially in the plane of the patterning object MA. In the embodiment shown, each seta 10 has a width a. The length of each seta is 4a. Depending on the mechanical properties required of the adhesion, for example, stiffness and resiliency in certain dimensions, the ratio of the width to the length will vary.

Figure 5:
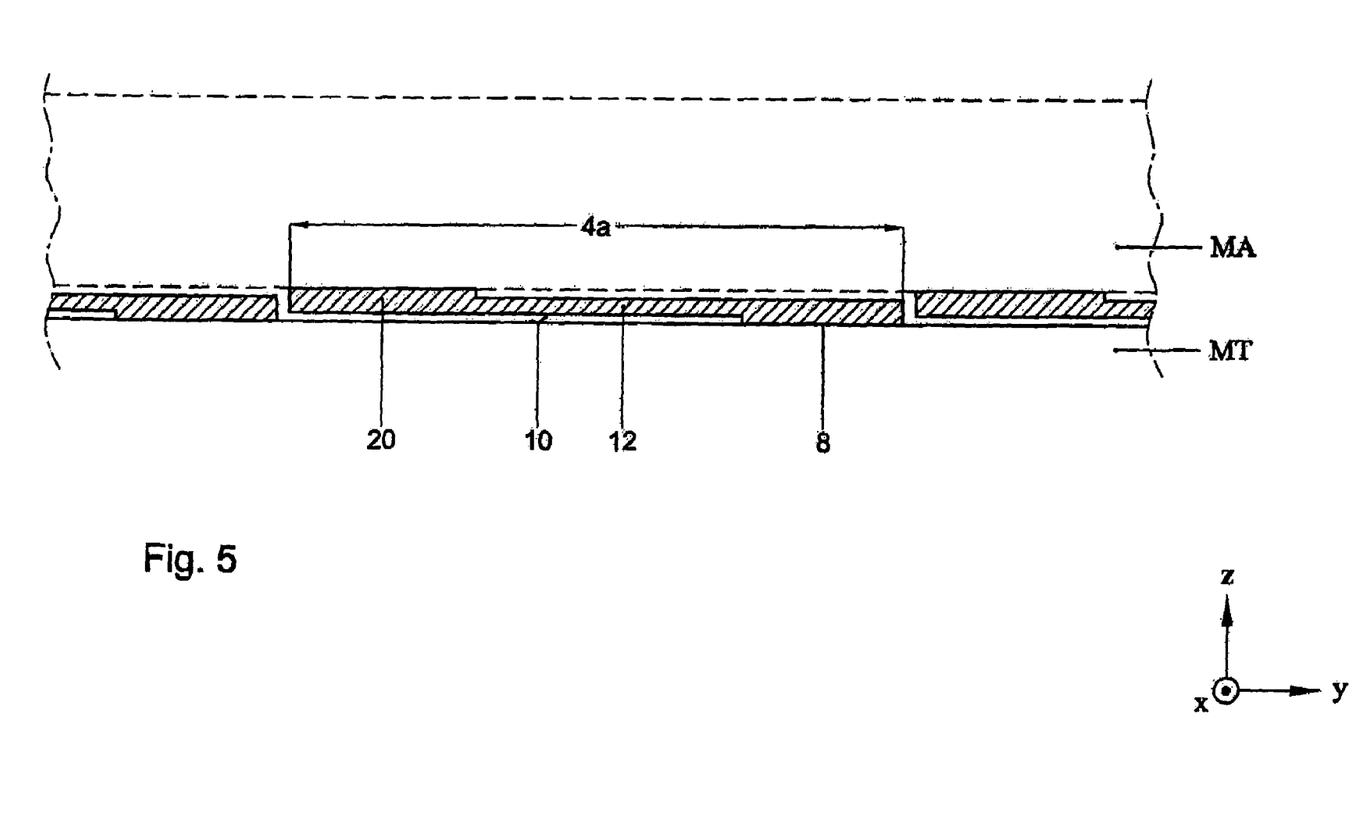
FIG. 5 depicts a cross section of a plurality of setae supporting a mask according to an embodiment of the invention.

FIG. 5 depicts a cross section of at least one complete seta supporting a mask MA according to an embodiment of the invention. In the embodiment shown, the plurality of setae 10 acts as a plurality of leaf springs. The leaf springs are constructed and arranged so as to provide relative stiffness in the scanning direction and relative resilience in the Z direction, that is in a direction out of the plane in which the mask is to be disposed. By providing relative stiffness in the scanning direction Y, the shearing force caused by the acceleration and deceleration of the mask table MT is counteracted. The plurality of leaf springs comprise a first portion 8, a second portion 20 and an intermediate portion 12. The intermediate portion 12 joins the first and second portions 8, 20. The second portion 20 comprises the sub-contact area, that is the actual contact with the mask. The intermediate portion 12 is resilient. In particular, the intermediate portion 12 is resilient in a direction extending out of a plane in which the patterning object is disposed, respectively, in the depicted situation in the Z-direction. The first portion 8 is in contact with the inner upper facing surface of the cup CU, SC. The ratio of the length of the leaf spring with respect to its width depends on the required stiffness ratio of intermediate portion 12 in the Z and Y directions. The first portion 8 is offset in the scanning direction Y with respect to the second portion 10. In this way, relative stiffness in the scanning direction is achieved.

Figure 6:
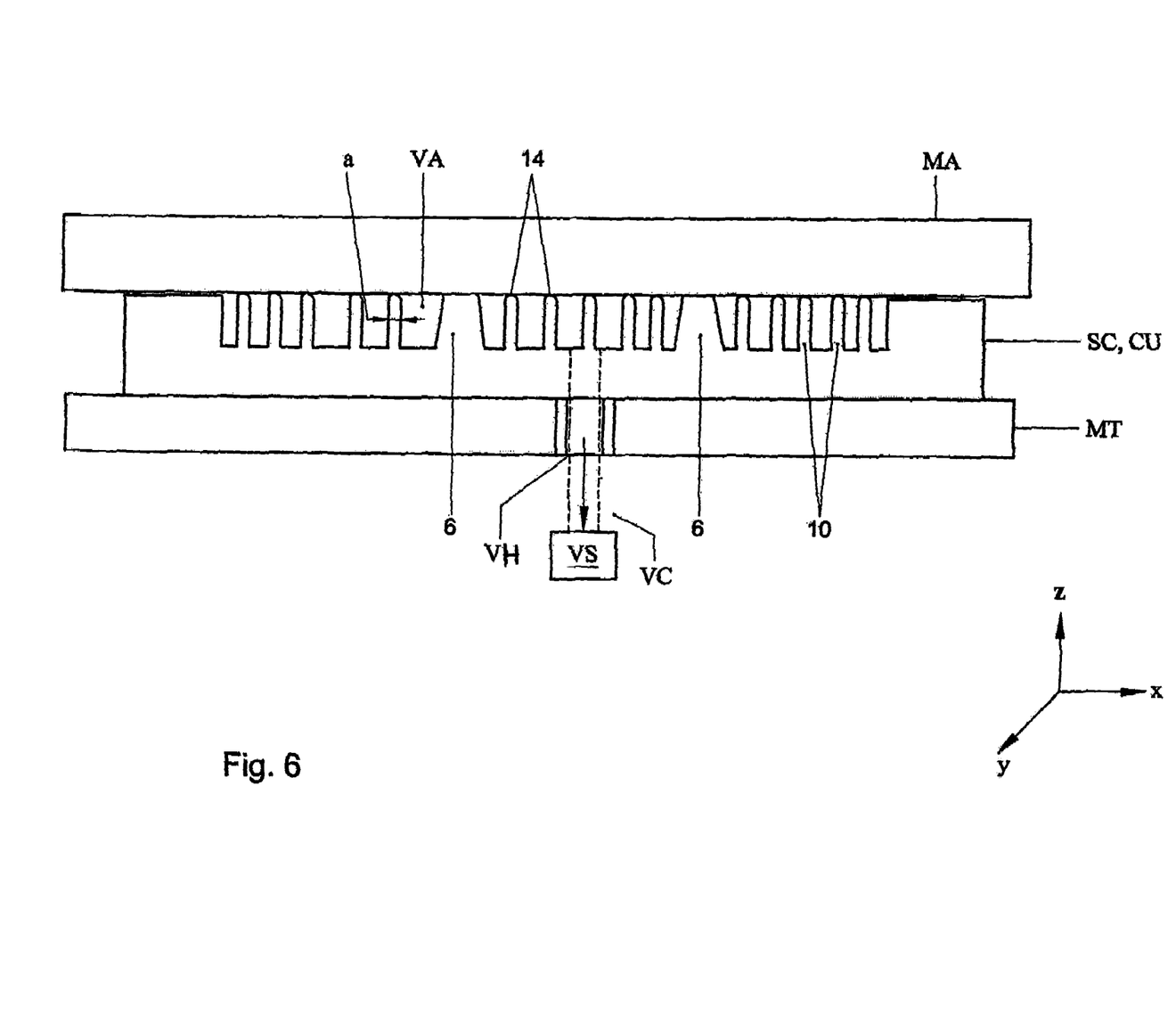
FIG. 6 depicts an end on view in cross section of a mask table supporting a mask according to an embodiment of the present invention.

FIG. 6 depicts an end on view in cross section of a mask table MT supporting a mask MA according to an embodiment of the present invention. In the embodiment shown, the suction cup CU, SC is disposed on the mask table MT. In one embodiment, the cup CU forms part of the mask table MT. The suction cup SC, CU is provided with burls 6 and micro terminal elements 10, also referred to as setae as mentioned above. The micro terminal elements 10 have a width a. The micro terminal elements 10 have a plurality of sub-contact surfaces 20 comprising a convex curve shaped contact portion 14. In this way, adhesion is further optimized. The vacuum clamp VC further comprises a vacuum hole VH which extends through the mask table MT and suction cup SC, CU. The vacuum hole VH is connected to a vacuum supply VS which creates a relative low pressure region in the vacuum area VA. The vacuum supply VS includes a controller which determines the extent of the vacuum to be supplied. The controller is adapted to take into account the adhesive forces generated by the plurality of setae in contact with the mask MA.

Figure 7:
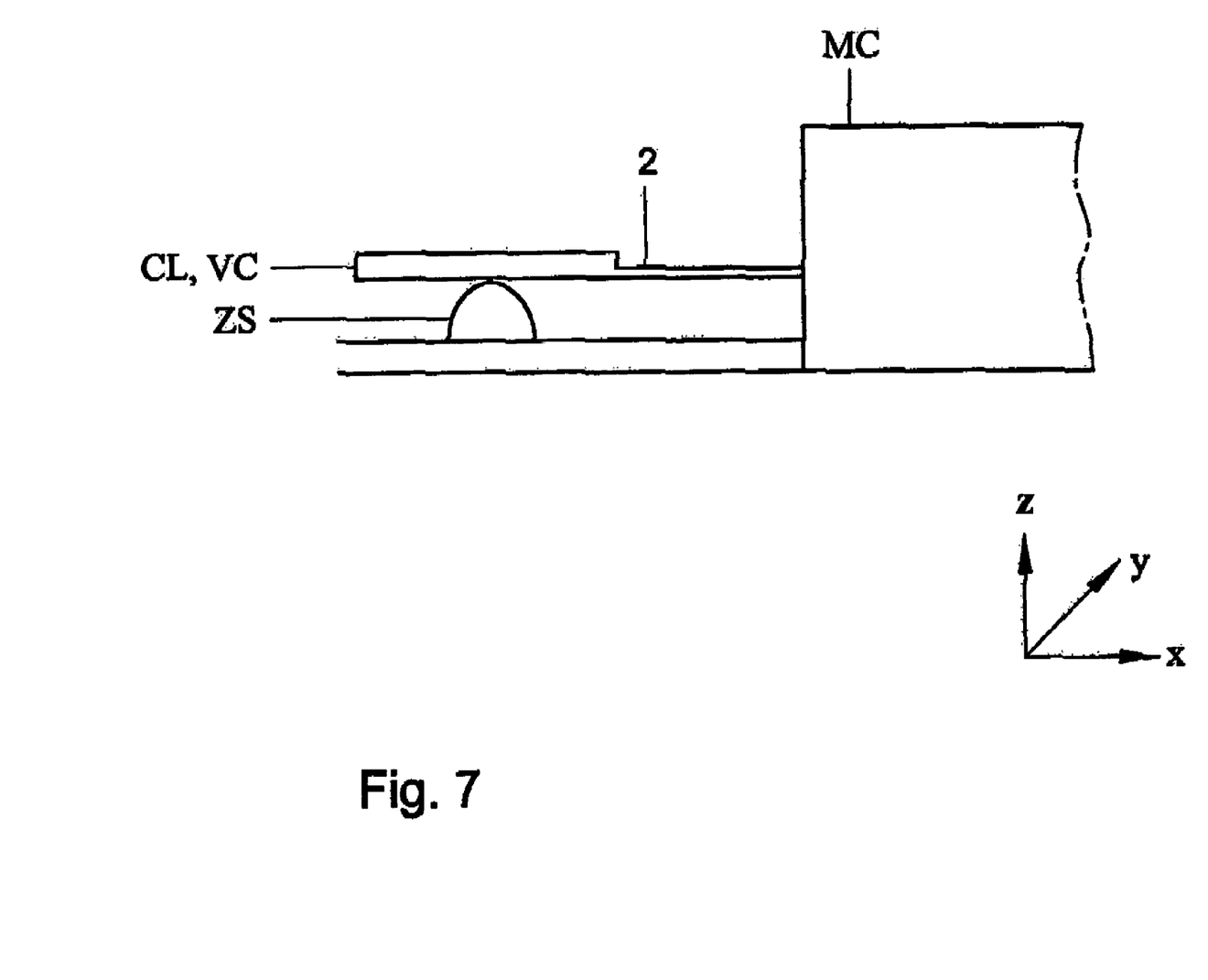
FIG. 7 depicts cross section details of a mask table according to an embodiment of the invention.

FIG. 7 depicts cross section details of a mask table according to an embodiment of the invention. In particular, FIG. 7 depicts the clamp VC, CL which includes the cup CU, SC mounted on the mask chuck MC via leaf spring 2 and supported in the Z direction by Z-support ZS. The Z direction is a direction extending out of the plane in which the mask MA or substrate W is disposed. The Z-direction is typically substantially perpendicular to the plane in which the mask MA or substrate W is disposed. In other words, the Z direction is substantially parallel to the optical axis of the projection system.

The plurality of setae may be manufactured in the cup CU or any other suitable structure using micro electro mechanical system (MEMS) technology. The setae can be monolithic, i.e. the setae may be made of the same material as the mask table. In addition, they may be provided with a coating layer disposed at the contact area of the setae.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning object defines the pattern created on a substrate. The topography of the patterning object may be pressed into a layer of resist supplied to the substrate whereupon the resist is cured by applying electromagnetic radiation, heat, pressure or a combination thereof. The patterning object is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
   (i) a support structure constructed to support a patterning object, the patterning object being capable of imparting a radiation beam with a pattern in its cross-section to form a patterned radiation beam, or (ii) a substrate table constructed to hold a substrate, or (iii) both (i) and (ii); and
   wherein the support structure, the substrate table, or both, comprises a contact surface configured to be in contact with the patterning object, the substrate, or both, respectively, the contact surface comprising a plurality of sub-contact surfaces to provide adhesion between the support structure and the patterning object, the substrate table and the substrate, or both, in addition to that merely provided by any clamping force applied to and/or weight of the patterning object and/or substrate.

2. The apparatus according to claim 1, wherein the support structure, the substrate table, or both, comprises a plurality of setae comprising the plurality of sub-contact surfaces.

3. The apparatus according to claim 2, wherein the support structure, the substrate table, or both, are arranged to move in a scanning direction, and wherein the plurality of setae are constructed to provide stiffness in the scanning direction.

4. The apparatus according to claim 2, wherein the plurality of setae are constructed to provide flexibility in a direction substantially perpendicular to a plane in which the patterning object, the substrate, or both, are disposed, respectively.

5. The apparatus according to claim 2, wherein the plurality of setae are configured to act as a plurality of leaf springs.

6. The apparatus according to claim 3, wherein the plurality of setae are configured to act as a plurality of leaf springs.

7. The apparatus according to claim 4, wherein the plurality of setae are configured to act as a plurality of leaf springs.

8. The apparatus according to claim 5, wherein each of the plurality of leaf springs comprise a first portion, a second portion and an intermediate portion joining the first and second portions, wherein the second portion comprises a sub-contact surface of the plurality of sub-contact surfaces and the intermediate portion is resilient in a direction extending out of a plane in which the patterning object, the substrate, or both, are disposed, respectively.

9. The apparatus according to claim 8, wherein the first portion is offset in the scanning direction with respect to the second portion.

10. The apparatus according to claim 2, wherein the support structure, the substrate table, or both, further comprises a vacuum clamp, the vacuum clamp having a suction cup having a vacuum clamp area, wherein the plurality of setae are provided in the vacuum clamp area.

11. The apparatus according to claim 1, wherein the sub-contact surfaces form a patterned surface structure.

12. The apparatus according to claim 1, wherein the sub-contact surfaces provide a combined adhesion energy sufficient to adhere the patterning object to the support structure, the substrate to the substrate table, or both.

13. The apparatus according to claim 1, further comprising a motor configured to move the support structure, the substrate table, or both, in a scanning direction, the motor configured to exert an acceleration force on the support structure, the substrate table, or both, in the scanning direction, wherein the mutual adhesion between the patterning object and the support structure, the substrate and the substrate table, or both, respectively, is configured to hold the patterning object on the support structure, the substrate on the substrate table, or both, respectively, when the support structure, the substrate table, or both, respectively, are moved in the scanning direction.

14. The apparatus according to claim 2, wherein the plurality of setae are micro terminal elements.

15. The apparatus according to claim 2, wherein each of the plurality of sub-contact surfaces comprise a convex curve shaped contact portion.

16. An apparatus comprising a support structure constructed to support an object comprising a lithographic patterning device or a lithographic substrate and arranged to move in a direction, the support structure comprising a contact surface with which the object is configured to be removably in contact, the contact surface comprising a plurality of sub-contact surfaces themselves arranged to provide an adhesion between the support structure and the object, so that the object is held on the support structure when the support structure moves in the direction.

17. A device manufacturing method, comprising:
   (i) supporting a patterning object on a support structure, the patterning object being capable of imparting a radiation beam with a pattern in its cross-section to form a patterned radiation beam, or (ii) holding a substrate on a substrate table, or (iii) both (i) and (ii), wherein the support structure, the substrate table, or both, comprises a contact surface with which the patterning object, the substrate, or both, is removably in contact, respectively, the contact surface comprising a plurality of sub-contact surfaces themselves arranged to provide adhesion between the support structure and the patterning object, the substrate table and the substrate, or both, respectively; and projecting a patterned beam of radiation onto a substrate.

18. A method comprising supporting an object comprising a lithographic patterning device or a lithographic substrate on a support structure, wherein the support structure is arranged to move in a direction and comprises a contact surface with which the object is in contact, the contact surface comprising a plurality of sub-contact surfaces to provide an adhesion between the support structure and the object in addition to that merely provided by any clamping force applied to and/or weight of the patterning object and/or substrate, so that the object is held on the support structure when the support structure moves in the direction.

19. A method of manufacturing a support structure configured to support an object, the support structure comprising a contact surface comprising a plurality of sub-contact areas to increase an adhesion between the support structure and the object, comprising manufacturing the plurality of sub-contact areas using a MEMS technology.

20. The method according to claim 19, wherein the support structure is a support structure configured to support a patterning object capable of imparting a radiation beam with a pattern in its cross-section to form a patterned radiation beam.

* * * * *